(12) United States Patent
Kawai

(10) Patent No.: US 10,223,781 B2
(45) Date of Patent: Mar. 5, 2019

(54) SOFT BACK-UP PIN STATE CHECKING DEVICE

(71) Applicant: FUJI CORPORATION, Chiryu (JP)

(72) Inventor: Hidetoshi Kawai, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 15/021,195

(22) PCT Filed: Sep. 23, 2013

(86) PCT No.: PCT/JP2013/075600
§ 371 (c)(1),
(2) Date: Mar. 10, 2016

(87) PCT Pub. No.: WO2015/040755
PCT Pub. Date: Mar. 26, 2015

(65) Prior Publication Data
US 2016/0225136 A1  Aug. 4, 2016

(51) Int. Cl.
G06T 7/50 (2017.01)
G06T 7/00 (2017.01)
(Continued)

(52) U.S. Cl.
CPC .............. *G06T 7/0004* (2013.01); *G06K 9/78* (2013.01); *G06T 7/13* (2017.01); *G06T 7/50* (2017.01);
(Continued)

(58) Field of Classification Search
CPC ... G06T 2207/20132; G06T 7/90; G06T 7/50; H04N 5/3454; G06K 19/04; G06K 9/78
See application file for complete search history.

(56) References Cited

U.S. PATENT DOCUMENTS 5,387,137 A * 2/1995 Bouwknegt ............ H01R 43/20
439/736
5,924,192 A * 7/1999 Wuyts ................ H05K 13/0812
29/833
(Continued)

FOREIGN PATENT DOCUMENTS

JP  2002-50899 A   2/2002
JP  2002-319800 A  10/2002
(Continued)

OTHER PUBLICATIONS

Extended European Search Report dated Aug. 22, 2016 in Patent Application No. 13894038.2.
(Continued)

*Primary Examiner* — Chan Park
*Assistant Examiner* — Mai Tran
(74) *Attorney, Agent, or Firm* — Oblon, McClelland, Maier & Neustadt, L.L.P.

(57) ABSTRACT

A soft back-up pin state checking device including a soft back-up pin formed of a bottom-side holder portion, and a top-side soft pin portion which is held by the holder portion in an exchangeable manner. A ring-shaped background portion which is possible to be distinguished from the soft pin portion and be recognized using image processing is provided on a top end surface of a cylindrical fitting portion which is outside of an outer circumference of the soft pin portion in the holder portion of the soft back-up pin.

11 Claims, 10 Drawing Sheets (a) IMAGE OF NORMAL STATE (b) IMAGE OF BENT STATE

(51) Int. Cl.
  *H05K 13/00* (2006.01)
  *G06K 9/78* (2006.01)
  *G06T 7/73* (2017.01)
  *G06T 7/13* (2017.01)
  *G06T 7/90* (2017.01)
  *H05K 13/08* (2006.01)

(52) U.S. Cl.
  CPC .............. *G06T 7/73* (2017.01); *G06T 7/90* (2017.01); *H05K 13/0061* (2013.01); *H05K 13/0812* (2018.08); *G06T 2207/10024* (2013.01); *G06T 2207/30141* (2013.01)

(56) References Cited

U.S. PATENT DOCUMENTS

| | | | | |
|---|---|---|---|---|
| 5,940,960 A * | 8/1999 | Doan | ............... | B23P 19/04 29/221.5 |
| 6,002,437 A * | 12/1999 | Morioka | ............... | H04N 5/2252 348/373 |
| 6,212,751 B1 * | 4/2001 | Hattori | ............... | G05B 19/402 29/407.04 |
| 6,300,784 B1 * | 10/2001 | Yamamoto | ............... | G01R 1/0433 324/756.02 |
| 2002/0014001 A1 * | 2/2002 | Isogai | ............... | H05K 13/0069 29/739 |
| 2002/0138974 A1 * | 10/2002 | Suhara | ............... | H05K 13/0812 29/740 |
| 2002/0182915 A1 * | 12/2002 | Watanabe | ............... | H01R 13/2435 439/266 |
| 2005/0128344 A1 | 6/2005 | Suhara et al. | | |
| 2007/0153121 A1 * | 7/2007 | Pertierra | ............... | H04N 5/772 348/375 |
| 2007/0218737 A1 * | 9/2007 | Suhara | ............... | H05K 13/0069 439/259 |
| 2008/0048120 A1 * | 2/2008 | Gooch | ............... | G01J 5/10 250/338.4 |
| 2009/0082881 A1 | 3/2009 | Awata et al. | | |
| 2010/0296738 A1 * | 11/2010 | Sukegawa | ............... | G01B 11/24 382/199 |
| 2011/0268346 A1 * | 11/2011 | Ito | ............... | H05K 13/0069 382/151 |
| 2013/0276281 A1 * | 10/2013 | Yamashita | ............... | H05K 13/0015 29/407.04 |

FOREIGN PATENT DOCUMENTS

| | | | |
|---|---|---|---|
| JP | 2003-249798 A | 9/2003 | |
| JP | 2004-335973 A | 11/2004 | |
| JP | 4014270 B2 | 11/2007 | |
| JP | 2011-14627 A | 1/2011 | |
| JP | 2011-228583 A | 11/2011 | |
| JP | 2011-233736 A | 11/2011 | |
| JP | WO 2013084387 A1 * | 6/2013 | ......... H05K 13/0015 |

OTHER PUBLICATIONS

International Search Report dated Nov. 12, 2013 in PCT/JP2013/075600 filed Sep. 23, 2013.

Combined Chinese Office Action and Search Report dated Mar. 2, 2018 in Patent Application No. 201380079759.7 (with English language translation and translation of categories of cited documents).

Office Action dated Aug. 14, 2018 in European Patent Application No. 13 894 038.2 citing document AA therein, 7 pages.

* cited by examiner

[Fig. 1]
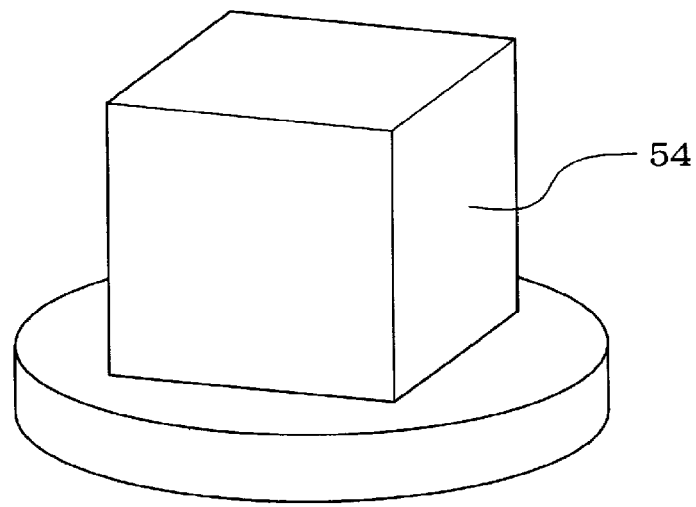
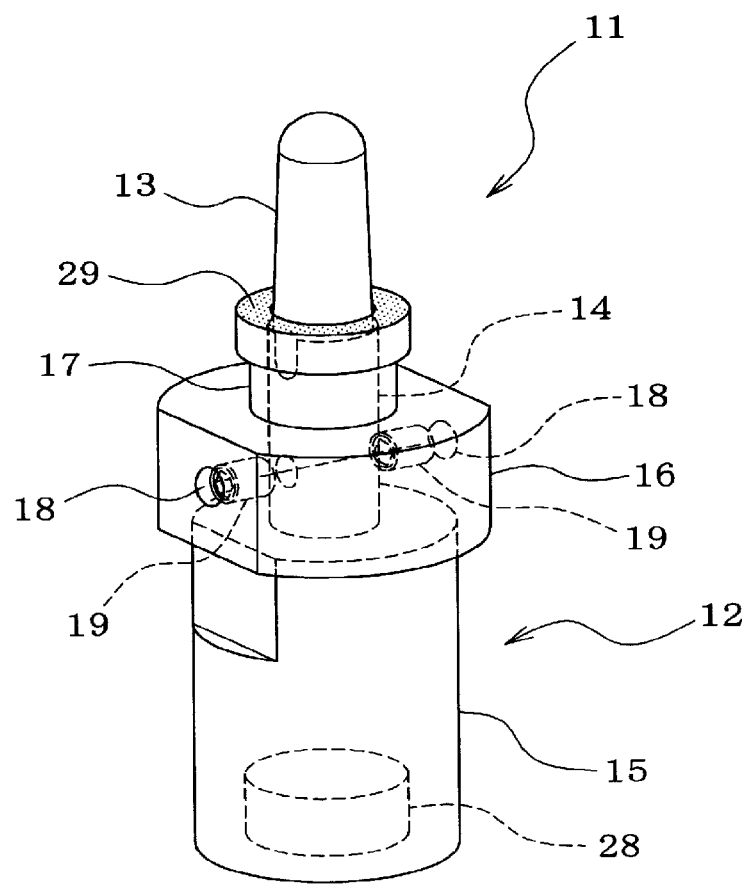

[Fig. 2]
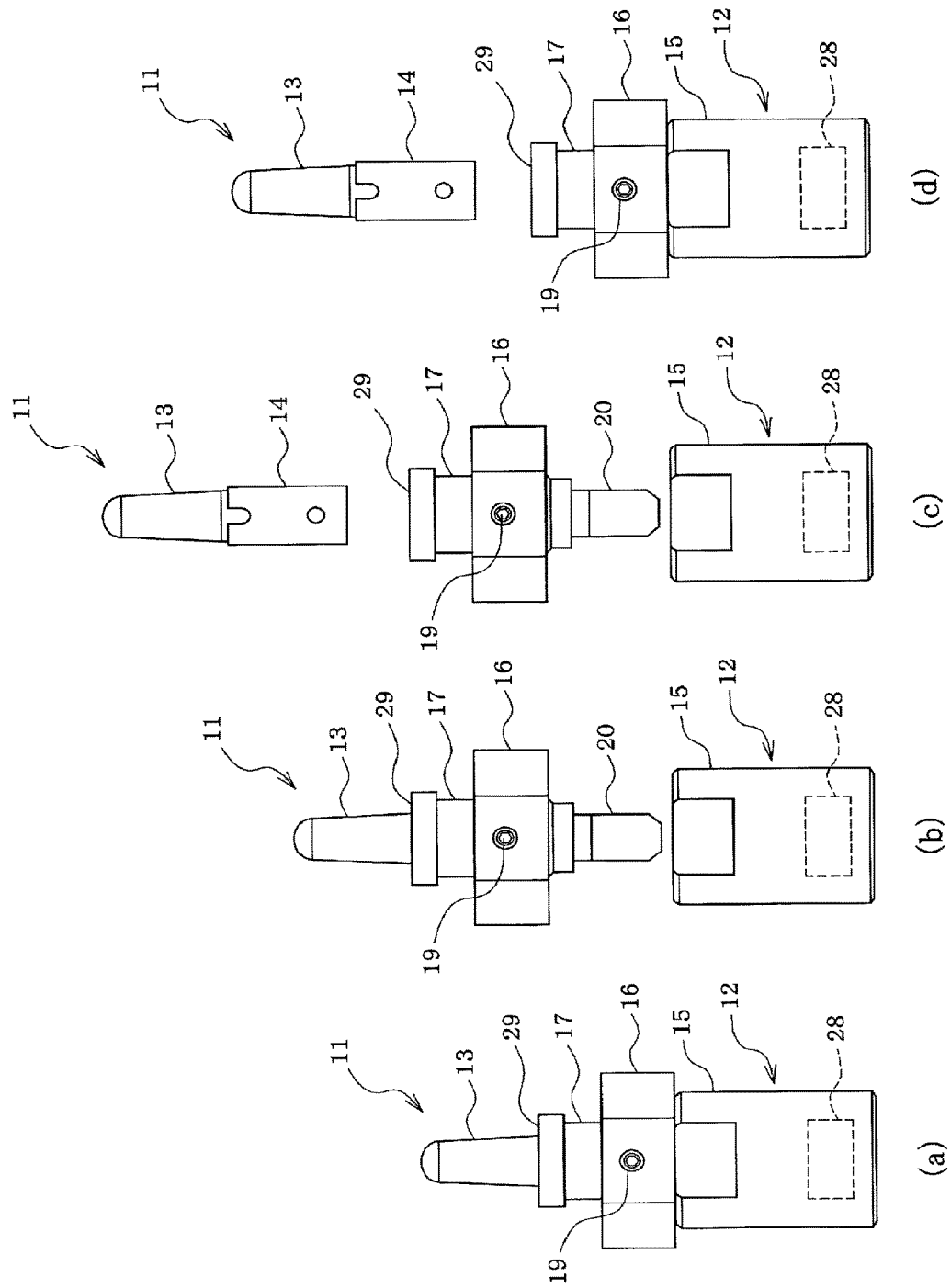

[Fig. 3]
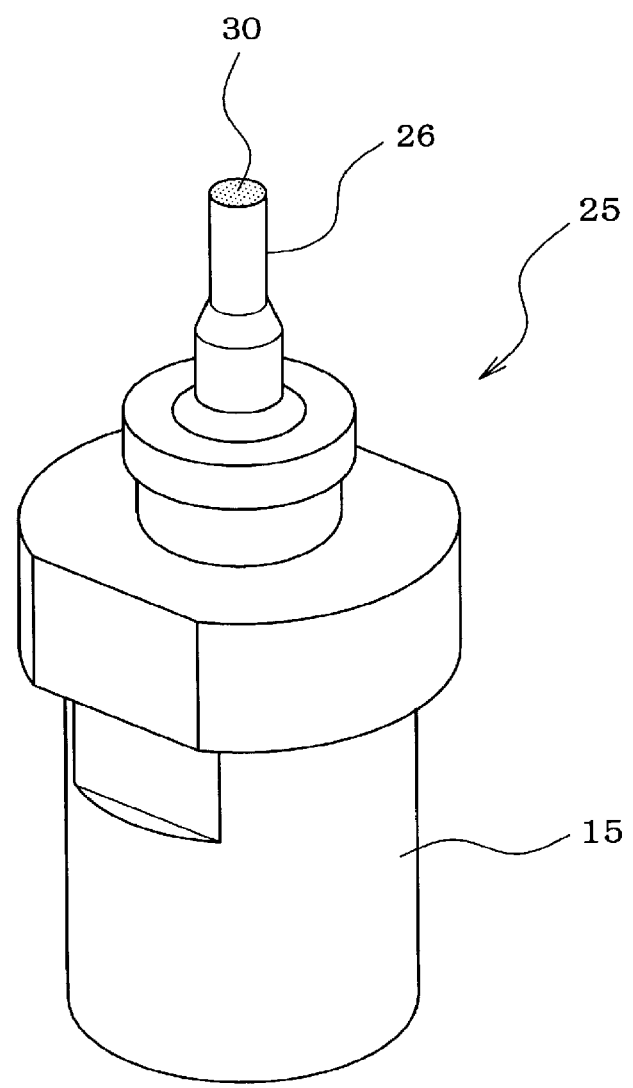

[Fig. 4]
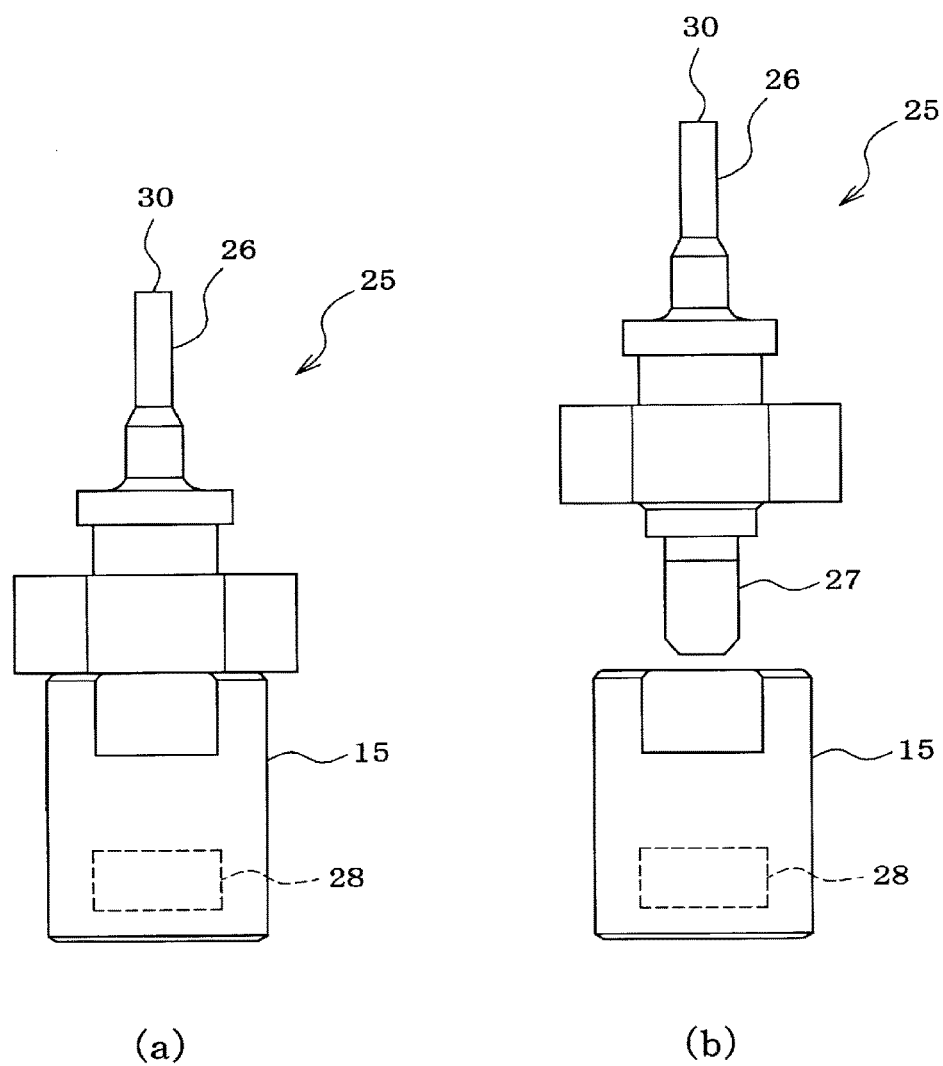
(a)   (b)

[Fig. 5]
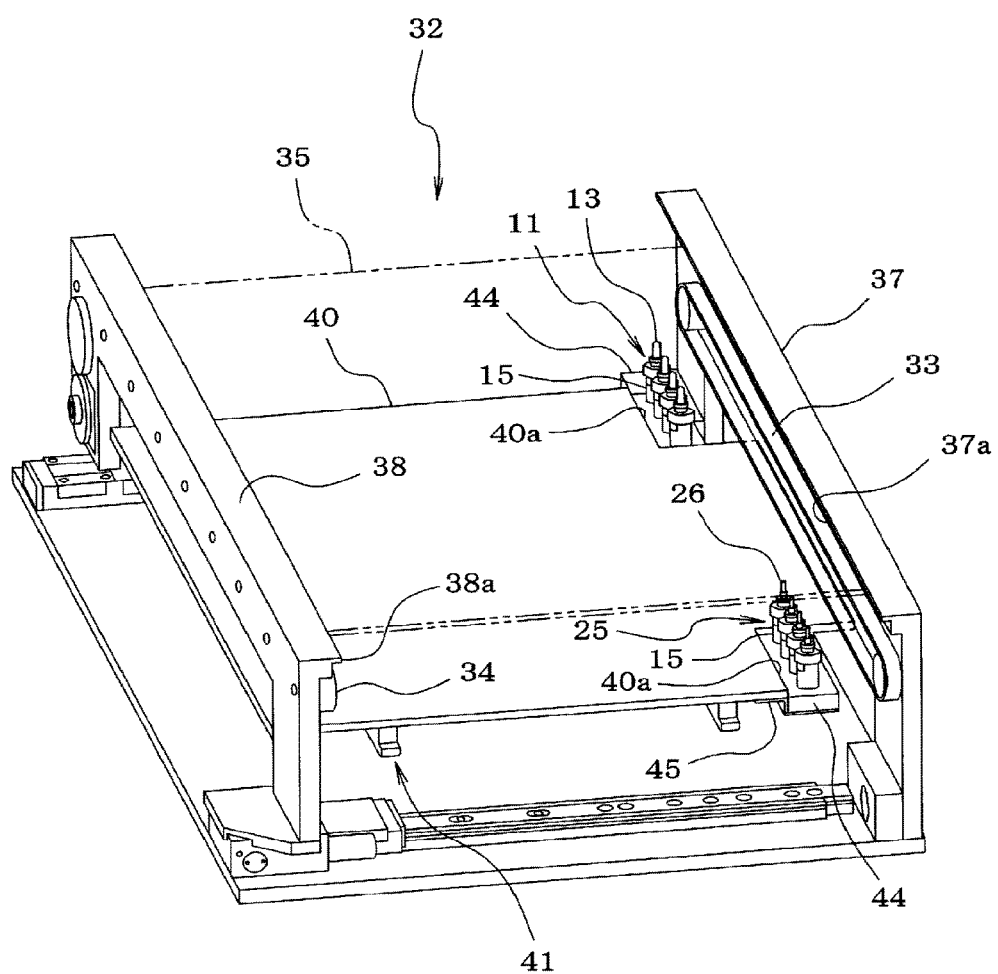

[Fig. 6]
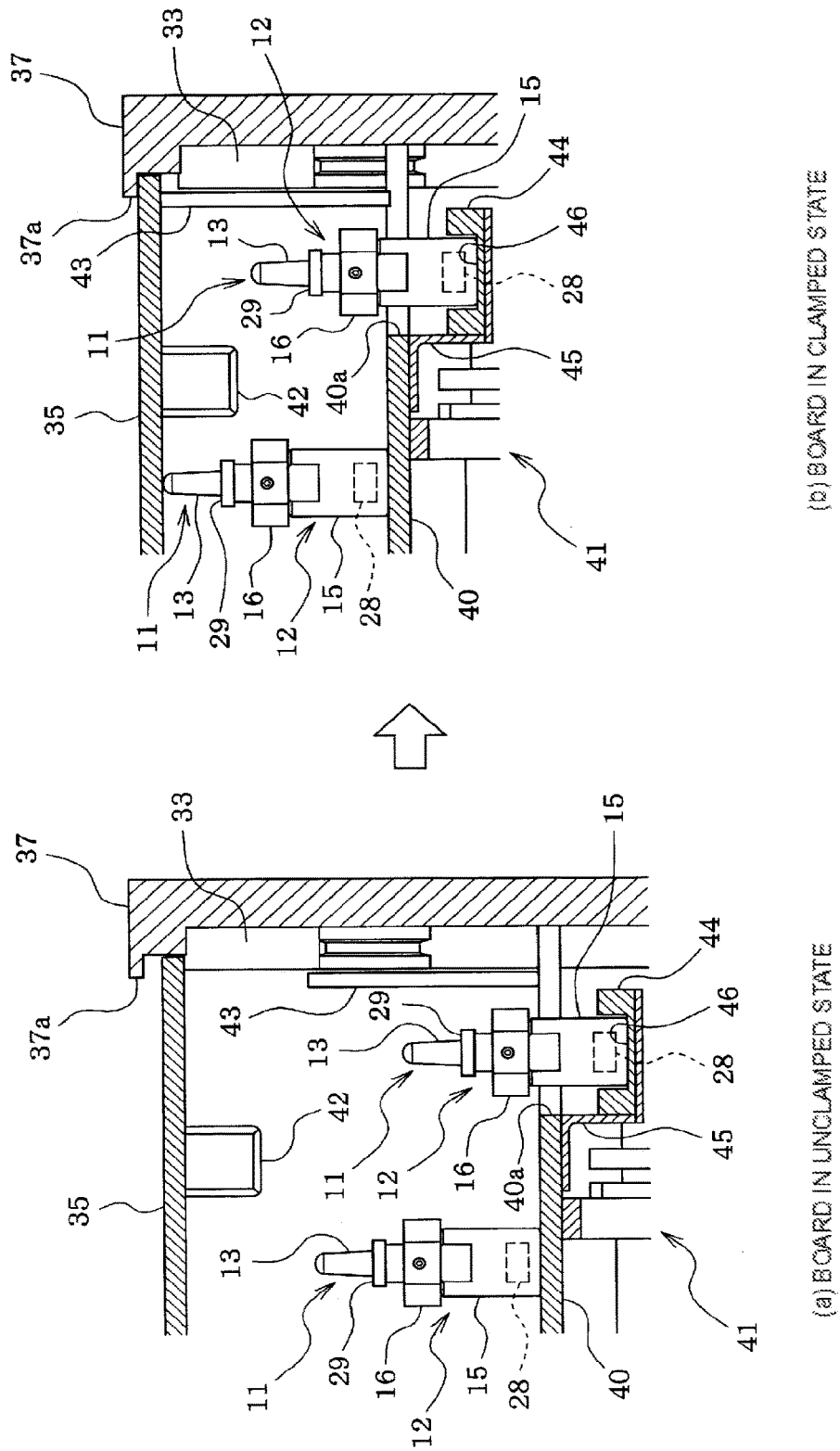

[Fig. 7]
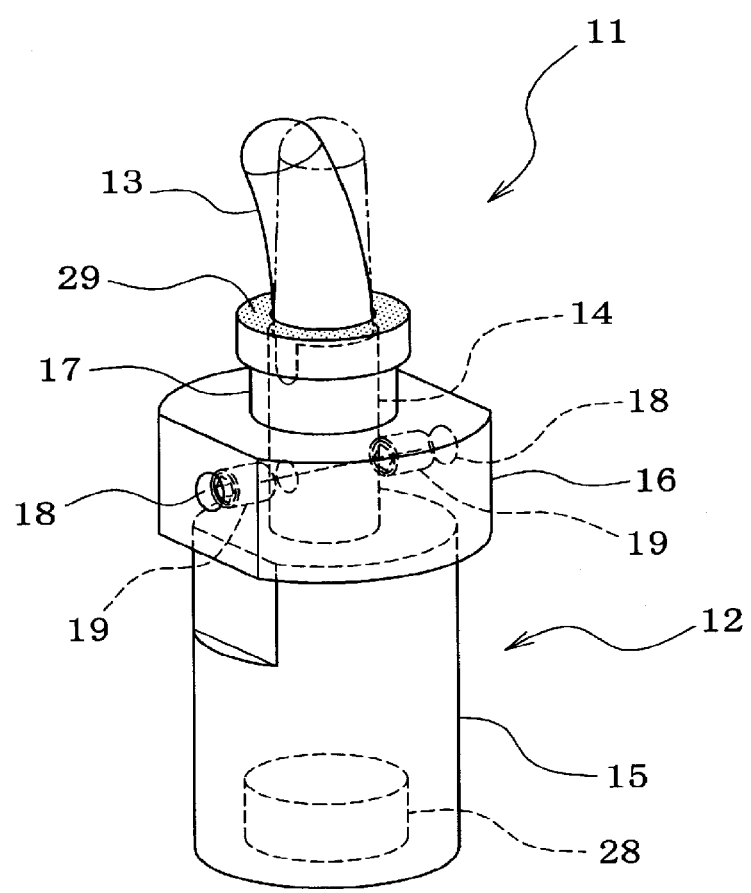

[Fig. 8]
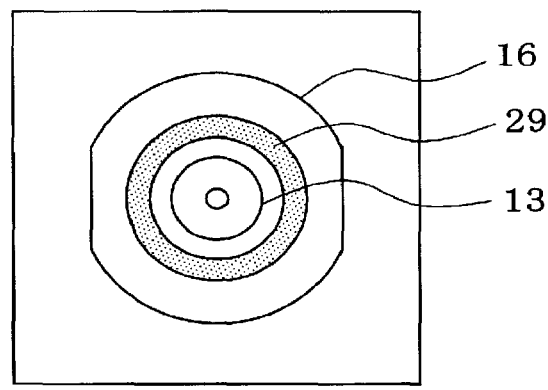
(a) IMAGE OF NORMAL STATE
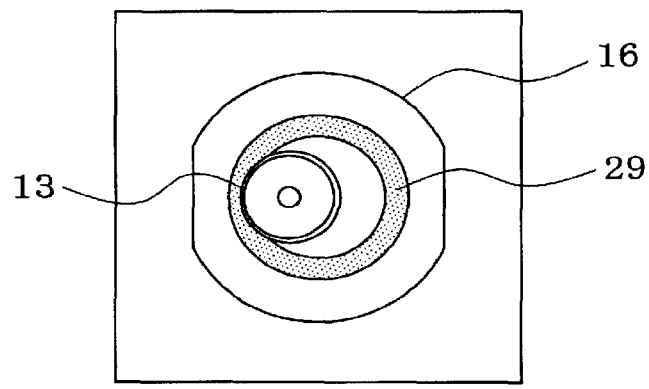
(b) IMAGE OF BENT STATE

[Fig.9]
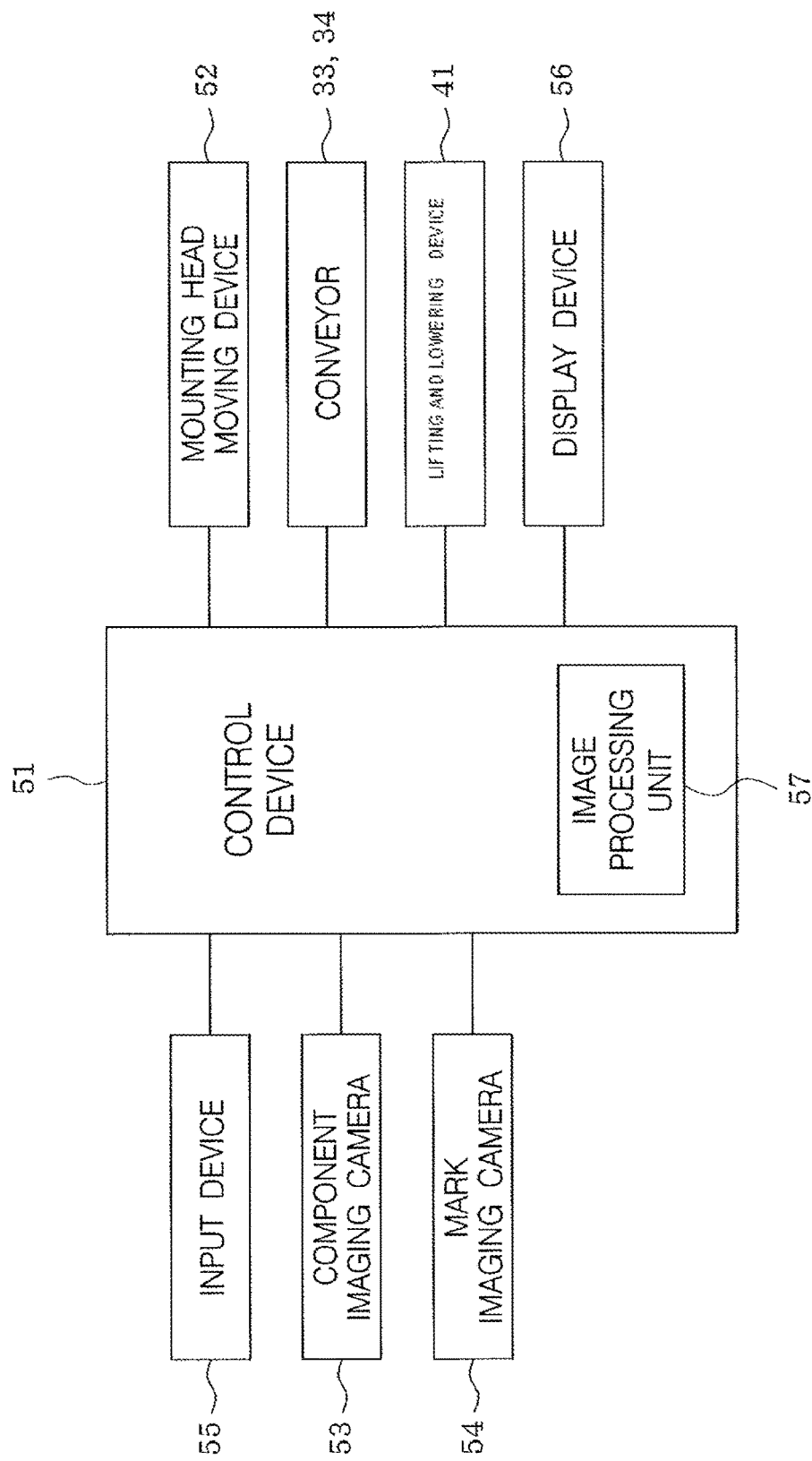

[Fig. 10]
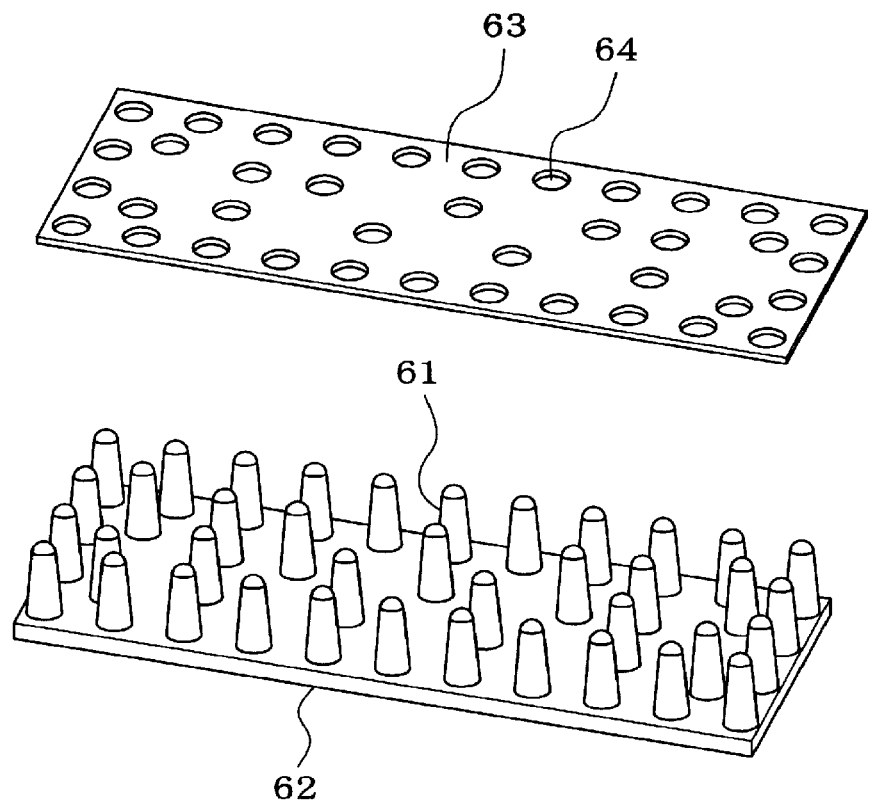
[Fig. 11]
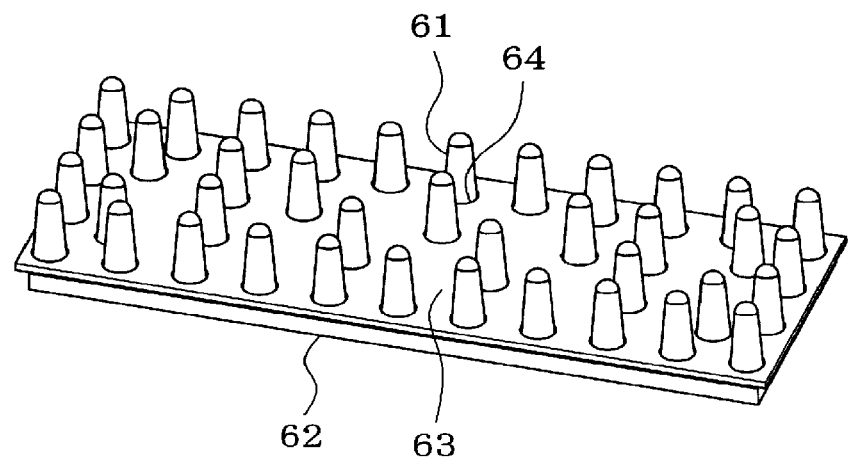

SOFT BACK-UP PIN STATE CHECKING DEVICE

TECHNICAL FIELD

The present disclosure relates to a soft back-up pin state checking device which checks the state of a soft back-up pin made of a soft elastic material which supports, from below, a circuit board onto which components are mounted in a component mounting station of a component mounting machine.

BACKGROUND ART

In recent years, since there has been progress in reducing the thickness of component-mounted boards, and the component-mounted boards bend easily, in a case in which components are mounted on a circuit board using a component mounting machine, the circuit board is prevented from bending by supporting the circuit board from below using back-up pins. In order to satisfy the demand for an increase in mounting density and a reduction in size in recent years, frequently, there is a requirement for a double-sided mounting board in which components are mounted to both surfaces of the circuit board. In a case in which the double-sided mounting board is produced using a component mounting machine, first, components are mounted on one surface of the printed circuit board, and subsequently, the printed circuit board is turned over and re-inserted into the component mounting machine, and components are mounted to the remaining other surface of the printed circuit board.

During the mounting of components on the remaining other surface of the printed circuit board, when a back-up pin supporting the printed circuit board from below makes contact with a previously-attached component of the bottom surface of the printed circuit board, since there is a possibility that the previously-attached component will be damaged or the printed circuit board will be pushed upward, as described in PTL 1 (JP-A-2004-335973), the back-up pins are formed of a soft elastic material such as urethane, and when the tip portion of a pin makes contact with a previously-attached component, the tip portion of the pin elastically deforms to prevent the damaging of the previously-attached component or the pushing up of the printed circuit board. In general, a back-up pin capable of elastic deformation is referred to as a "soft back-up pin".

In a case in which a double-sided mounting board is produced using soft back-up pins, there is a system in which a pin block in which multiple soft back-up pins are formed integrally in a matrix on a block board is used, and a worker pulls off unnecessary soft back-up pins according to the disposition of the previously-attached components for each type of printed circuit board to be produced. Alternatively, as described in PTL 1, there is a system in which multiple attachment holes are formed in the back-up plate (a pin supporting board) in a matrix, a fitting protrusion portion which fits in the attachment holes is formed on the bottom end of the soft back-up pin, and the worker selects the attachment holes which fit the fitting protrusion portions of the bottom ends of the soft back-up pins according to the disposition of the previously-attached components for each type of printed circuit board to be produced and attaches the soft back-up pins to the back-up plate.

In general, in the component mounting machine, fiducial marks on a circuit board are imaged by a camera, the image thereof is processed to recognize the fiducial marks, and a component mounting position on the circuit board is determined using the position of the fiducial marks as a reference. Therefore, as described in PTL 2 (Japanese Patent No. 4014270), there is a system in which the fiducial position detection technique of the circuit board is applied to the position detection technique of the back-up pin, a fiducial mark is provided on the top end surface of the back-up pin, the fiducial mark of the top end surface of the back-up pin is imaged by a camera, and by processing the image to recognize the fiducial mark, the position of the back-up pin is detected.

CITATION LIST

Patent Literature

PTL 1: JP-A-2004-335973
PTL 2: Japanese Patent No. 4014270

SUMMARY

Technical Problem

Since the soft back-up pin is a sponge molded product, the shape is unstable, and, as illustrated in FIG. 10, in a block molded product in which a plurality of soft back-up pins (61) are integrally molded on a block board (62), since the color of the top end of the soft back-up pin and the color of the block board are the same and the difference in contrast therebetween is small, it is difficult to accurately recognize the top end of the soft back-up pin using image processing. Therefore, it is conceivable to apply the fiducial position detection technique of the circuit board of PTL 2 described above to the position detection technique of the soft back-up pin, provide a fiducial mark on the top end surface of the soft back-up pin, image the fiducial mark of the top end surface of the soft back-up pin using a camera, process the image of the fiducial mark, and recognize the fiducial mark to detect the position of the soft back-up pin.

However, since deformation such as bending of the soft back-up pin occurs easily, there is a case in which the position of the fiducial mark on the top end of the soft back-up pin is shifted due to deformation such as bending. Therefore, using a method of recognizing the fiducial mark on the top end of the soft back-up pin using image processing, it is not possible to distinguish positional shifting of the whole soft back-up pin from positional shifting of the fiducial mark caused by deformation such as bending. When deformation such as bending occurs in the soft back-up pin, since it is not possible to stably bear and support the circuit board in the correct position, it is necessary to develop a technique of detecting deformation such as bending of the soft back-up pin at an early stage.

Although there is a case in which solder which leaks from a through-hole of the circuit board adheres to the top end of the soft back-up pin, since there is a possibility that the solder will adhere to the bottom surface side of the circuit board and cause the circuit board to short circuit if production is continued with the solder still adhered to the top end of the soft back-up pin, it is necessary to develop a technique of detecting adhered matter such as solder on the top end of the soft back-up pin at an early stage.

Therefore, the problem to be solved by the disclosure is to provide a soft back-up pin state checking device capable of precisely checking the state (at least one of the shape of the outer circumferential edge, the position, deformation such as bending, and adhered matter such as solder) of a soft back-up pin.

Solution to Problem

In order to solve the problem described above, in the disclosure, there is provided a soft back-up pin state checking device which checks a state of a soft back-up pin made of a soft elastic material which supports, from below, a circuit board onto which components are mounted in a component mounting station of a component mounting machine, the soft back-up pin state checking device including a camera which images a region including the soft back-up pin from above, and image processing means for processing a captured image by the camera, in which a background portion which is possible to be distinguished from the soft back-up pin and be recognized using the image processing means is provided in an outer circumference of the soft back-up pin, and in which the image processing means recognizes an inner circumferential edge of the background portion as an outer circumferential edge of the soft back-up pin by processing the captured image by the camera and recognizing the background portion of the outer circumference of the soft back-up pin. In this manner, even if there is a situation in which it is difficult to accurately recognize the top end portion of the soft back-up pin using image processing, by providing the background portion which is possible to be recognized using image processing on the outer circumference of the soft back-up pin, it is possible to recognize the inner circumferential edge of the background portion which is recognized by the image processing as the outer circumferential edge of the soft back-up pin, and it is possible to precisely recognize the shape of the outer circumferential edge of the soft back-up pin.

Therefore, the image processing means may measure a position of the inner circumferential edge of the recognized background portion as a position of the soft back-up pin. Accordingly, it is possible to precisely detect the position of the soft back-up pin.

The image processing means may determine whether or not adhered matter such as solder is present on the soft back-up pin based on image processing results of an inside region of the recognized background portion. For example, when solder is adhered to the top end of the soft back-up pin, since the solder-adhered portion appears to be shining in the image which is captured by the camera, if a portion which appears to be shining is present in the region in which the soft back-up pin is present on the inside of the background portion, it is possible to determine that the portion is a solder-adhered portion.

The image processing means may determine that the soft back-up pin is deformed when a deformed portion is present in a shape of the inner circumferential edge of the recognized background portion. When deformation such as bending occurs in the soft back-up pin, since the position of the top end of the soft back-up pin shifts, the image of the background portion which is captured by the camera is an image in which the top end of the soft back-up pin overhangs the background portion, and the shape of the inner circumferential edge of the background portion is partially deformed. Therefore, by determining whether or not a deformed portion is present in the shape of the inner circumferential edge of the background portion which is recognized by the image processing, it is possible to precisely recognize deformation such as bending of the soft back-up pin.

In this case, the background portion may be formed in a ring shape, and the outer circumferential edge (the outer circumference) of the background portion may be checked to recognize the position of the soft back-up pin in a case in which it is determined that the soft back-up pin is deformed. In this manner, it is possible to automatically exchange the soft back-up pin in which there is deformation such as bending for another soft back-up pin, and it is possible to continue production without stopping the component mounting machine.

The soft back-up pin state checking device may further be provided with warning means for warning a worker, when adhered matter on the soft back-up pin or deformation of the soft back-up pin is recognized by the image processing means, of the fact using a display and/or audio. In this manner, when adhered matter on the soft back-up pin or deformation of the soft back-up pin is recognized, it is possible to urge the worker to exchange the soft back-up pin.

In a case in which a function of automatically exchanging the soft back-up pin is installed in the component mounting machine, the component mounting machine may automatically exchange the soft back-up pin when adhered matter on the soft back-up pin or deformation of the soft back-up pin is recognized by the image processing means. In this manner, when adhered matter on the soft back-up pin or deformation of the soft back-up pin is recognized, it is possible to automatically exchange the soft back-up pin.

In a case in which the disclosure is carried out, the soft back-up pin may be formed of a bottom-side holder portion, and a top-side soft pin portion which is held by the holder portion in an exchangeable manner, and a background portion may be provided on a portion outside the outer circumference of the soft pin portion in the holder portion. In this manner, it is possible to use a common holder portion and a common background portion between a plurality of types of back-up pins with different materials and shapes.

In a case in which a pin block in which a plurality of the soft back-up pins are formed on a block board is used, a cover plate which overlaps the block board may be formed to be possible to be distinguished from the soft back-up pin and be recognized by the image processing means, and the cover plate may be used as the background portion by inserting the soft back-up pin through an insertion hole which is formed in the cover plate, overlapping the block board with the cover plate, and covering a top face of the block board with the cover plate. In this manner, even in a case in which a pin block in which the plurality of soft back-up pins are formed on the block board is used, it is possible to carry out the disclosure merely by causing the cover plate to overlap the block board.

Alternatively, instead of the cover plate, a top face of the block board may be colored to be possible to be distinguished from the soft back-up pin and be recognized by the image processing means and may be used as the background portion. In this manner, even in a case in which a pin block is used, it is possible to carry out the disclosure merely by coloring the top face of the block board such that it is possible to use the top face of the block board as the background portion.

BRIEF DESCRIPTION OF DRAWINGS

FIG. 1 is a perspective diagram illustrating a soft back-up pin and a camera which images the soft back-up pin in Example 1 of the disclosure.

FIG. 2A to 2D are diagrams explaining the assembly of the soft back-up pin of Example 1.

FIG. 3 is a perspective diagram illustrating a hard back-up pin.

FIG. 4A and FIG. 4B are diagrams explaining the assembly of the hard back-up pin.

FIG. 5 is a perspective diagram illustrating a component mounting station of a component mounting machine.

FIG. 6A is a vertical sectional diagram of a peripheral portion of a stocker illustrating a state when the printed circuit board is unclamped, and FIG. 6B is a vertical sectional diagram of the peripheral portion of the stocker illustrating a state when the printed circuit board is clamped.

FIG. 7 is a front diagram illustrating a state in which the soft back-up pin is bent.

FIG. 8A is a diagram illustrating an image in which a normal-state soft back-up pin is imaged by a camera, and FIG. 8B is a diagram illustrating an image in which a bent soft back-up pin is imaged by a camera.

FIG. 9 is a block diagram illustrating the configuration of a control system of the component mounting machine.

FIG. 10 is a perspective diagram illustrating a state in which a cover plate is removed from a block of the soft back-up pins of Example 2 of the disclosure.

FIG. 11 is a perspective diagram illustrating a state in which the cover plate is caused to overlap a block of the soft back-up pins, and background portions are formed on the outer circumferences of the soft back-up pins.

DESCRIPTION OF EMBODIMENTS

Hereinafter, description will be given of the two Examples 1 and 2 which embody modes for carrying out the disclosure.

Example 1

Description will be given of Example 1 of the disclosure based on FIGS. 1 to 9. First, description will be given of the configuration of a soft back-up pin 11 based on FIGS. 1 and 2.

The soft back-up pin 11 is formed of a bottom-side holder portion 12, and a top-side soft pin portion 13 which is held by the holder portion 12 in an exchangeable manner. The soft pin portion 13 is formed of a soft elastic material such as urethane or rubber to be elastically deformable, and a cylindrical support metal fitting 14 which holds a columnar shape is mounted and fixed to the bottom portion of the soft pin portion 13.

Meanwhile, the holder section 12 is a two piece structure formed of a holder main body 15 and a plug section 16, a cylindrical fitting section 17 is formed facing upward on the top side of the plug section 16, and the support metal fitting 14 of the soft pin portion 13 is fitted in the fitting portion 17 in a detachable manner. A screw hole 18 (refer to FIG. 1) is formed in the plug section 16 to penetrate to the inside of the fitting portion 17, and the soft pin portion 13 is fixed to the plug section 16 by fastening a fixing screw 19 in the screw hole 18 to cause the tip portion of the fixing screw 19 to press against the support metal fitting 14 of the soft pin section 13. Here, the reason for fixing the soft pin portion 13 to the plug portion 16 is to prevent the soft pin portion 13 from coming out from the plug portion 16 due to the top end portion of the soft pin portion 13 adhering to a circuit board 35. A protruding section 20 is formed facing downward on the bottom side of the plug portion 16, and the protruding section 20 is configured to fit, in a detachable manner, in a fitting hole (not shown) which is formed on the top side of the holder main body 15.

In a case in which solder or the like gets on the soft pin portion 13, or the soft pin portion 13 is damaged, only the soft pin portion 13 may be exchanged by loosening the fixing screw 19 to have the soft pin portion 13 removable from the fitting portion 17 of the plug portion 16.

Meanwhile, the holder main body 15 of the soft back-up pin 11 is also used as the holder main body 15 of a hard back-up pin 25 illustrated in FIGS. 3 and 4. The hard back-up pin 25 is formed of a hard pin portion 26 and the holder main body 15. The hard pin portion 26 is formed of a hard material such as metal or plastic, a protruding section 27 is formed facing downward on the bottom side of the hard pin portion 26, and the protruding section 27 is configured to fit, in a detachable manner, in a fitting hole (not shown) which is formed in the top side of the holder main body 15. A circular recognition mark 30 which can be recognized by image processing is provided on the top end surface of the hard pin portion 26. Either of the soft pin portion 13 and the hard pin portion 26 may be selectable from among plural types of pin sections with different shapes and materials when exchanged.

A magnet 28 which holds the holder main body 15 on a back-up plate 40 which is described later using magnetic force is provided on the bottom side of the holder main body 15.

A ring-shaped background portion 29 which is possible to be distinguished from the soft pin portion 13 and be recognized using the image processing described later is provided on the top end surface of the cylindrical fitting portion 17 which is a portion outside the outer circumference of the soft pin portion 13 in the holder portion 12 of the soft back-up pin 11, and the ring-shaped background portion 29 also functions as a recognition mark of the soft back-up pin 11. Since the shape of the ring-shaped background portion 29 which is the recognition mark of the soft back-up pin 11 differs from the shape of the recognition mark 30 of the hard back-up pin 25, it is possible to distinguish the soft back-up pin 11 from the hard back-up pin 25 by recognizing the mark shape using image processing.

Next, description will be given of the configuration of a component mounting station 32 of the component mounting machine using FIGS. 5 and 6. The component mounting station 32 is a location in which components are mounted onto the circuit board 35 which is conveyed by conveyors 33 and 34 using a mounting head (not shown) of the component mounting machine. The conveyors 33 and 34 are disposed parallel to the conveyance direction of the circuit board 35 so as to convey the circuit board 35 by carrying both left and right side portions thereof, a rail 37 which holds the right-side conveyor 33 is a reference rail which has a fixed position, and a rail 38 which holds the left-side conveyor 34 is a movable rail which moves in the width direction of the circuit board 35 according to the width of the circuit board 35.

The back-up plate 40 on which the soft back-up pins 11 and the hard back-up pins 25 are mounted is provided horizontally in the component mounting station 32. The back-up plate 40 is formed of a magnetic material such as iron, and each of the back-up pins 11 and 25 is attracted and held on the back-up plate 40 by the magnet 28 of the holder main body 15. As illustrated in FIG. 6, the back-up plate 40 is configured to be lifted and lowered by a lifting and lowering mechanism 41, the lower limit position during a lowering operation is a board unclamped position illustrated in FIG. 6A, and the upper limit position during a lifting operation is a board clamped position illustrated in FIG. 6B.

As illustrated in FIG. 6A, in the state in which the back-up plate 40 is lowered to the board unclamped position, the top end of each of the back-up pins 11 and 25 on the back-up plate 40 is in a position lower than the bottom surface of the circuit board 35 on the conveyors 33 and 34, and, in a case in which there is a previously-attached component 42 mounted to the bottom surface of the circuit board 35 on the conveyors 33 and 34, the top end of the soft back-up pin 11 on the back-up plate 40 is provided to be lower than the bottom end of the previously-attached component 42 of the bottom surface of the circuit board 35.

Meanwhile, as illustrated in FIG. 6B, in the state in which the back-up plate 40 is lifted to the board clamped position, the top end of each of the back-up pins 11 and 25 on the back-up plate 40 abuts the bottom surface of the circuit board 35 on the conveyors 33 and 34, supports the circuit board 35 from below, and prevents the bending of the circuit board 35. When lifting the back-up plate 40 to the board clamped position, a clamp member 43 which is positioned on the inside of the conveyors 33 and 34 is lifted, and clamps both left and right side portions of the circuit board 35 by interposing the left and right side portions of the circuit board 35 between flange portions 37a and 38a which are provided on the inside of the top end of each of the rails 37 and 38 and the clamp member 43.

As illustrated in FIGS. 5 and 6, cutout portions 40a are formed in the vicinity of the inside of the reference rail 37 of the lateral end portions of the back-up plate 40, and stockers 44 which store a plurality of the back-up pins 11 and 25 are attached to the edge portions of the cutout portions 40a via fixture tools 45 (refer to FIG. 6). The stocker 44 is formed such that the plurality of back-up pins 11 and 25 can be mounted in a row along the inside of the reference rail 37. A plurality of recessed accommodation portions 46 (refer to FIG. 6) which fit one of the holder main body 15 of the plurality of back-up pins 11 and 25 each are formed in a row on the top face of the stocker 44, and are configured such that the back-up pin 11 or 25 which is stored in each of the recessed accommodation portions 46 is exposed from above from the cutout portion 40a of the back-up plate 40.

In Example 1, the stocker 44 is provided in two locations in the vicinity of the inside of the reference rail 37, the soft back-up pins 11 are stored in one of the stockers 44, and the hard back-up pin 25 are stored in the other stocker 44. Note that, in the production of a one-side-mounted board in which only the hard back-up pins 25 are used, only the hard back-up pins 25 may be stored in the stockers 44 of the two locations, and in the production of a double-sided mounting board in which only the soft back-up pins 11 are used, only the soft back-up pin 11 may be stored in the stockers 44 of the two locations.

Next, description will be given of an operation of transferring the back-up pin 11 or 25 on the back-up plate 40 using a chuck (not shown) which is held in the mounting head of the component mounting machine.

The movement operations of the mounting head and the opening and closing operations of the chuck are controlled by a control device 51 (refer to FIG. 9) of the component mounting machine. The operation of transferring each of the back-up pins 11 or 25 on the back-up plate 40 is performed in a state in which the circuit board 35 is not present above the back-up plate 40. At this time, the back-up plate 40 may be lifted to the board clamped position, and an operation of transferring each of the back-up pins 11 or 25 may be performed at the board unclamped position without lifting the back-up plate 40.

In a case in which the back-up pin 11 or 25 on the back-up plate 40 is removed and stored in the stocker 44, a mounting head moving device 52 (refer to FIG. 9) moves the mounting head to above the back-up pin 11 or 25 which is the removal target on the back-up plate 40, the holder main body 15 of the back-up pin 11 or 25 is grasped by the chuck of the mounting head, and, after the back-up pin 11 or 25 is pulled off from the back-up plate 40, the back-up pin 11 or 25 is moved to above the vacant recessed accommodation portion 46 of the stocker 44, and is stored in the recessed accommodation portion 46.

Note that, in a case in which the position of the back-up pin 11 or 25 which is mounted on the back-up plate 40 is transposed to another position on the back-up plate 40, the holder main body 15 of the back-up pin 11 or 25 which is the transposition target is grasped by the chuck, and after the back-up pin 11 or 25 is pulled off from the back-up plate 40, the back-up pin 11 or 25 is moved to above the transfer position which is the target on the back-up plate 40, and the back-up pin 11 or 25 is lowered to be mounted on the back-up plate 40. Accordingly, the back-up pin 11 or 25 is attracted and held in the transfer position which is the target on the back-up plate 40 by a magnetic force of the magnet 28 of the holder main body 15 of the back-up pin 11 or 25.

Meanwhile, in a case in which the back-up pin 11 or 25 which is stored in the stocker 44 is mounted at a pin mounting position which is the target on the back-up plate 40, the back-up pin 11 or 25 to be mounted on the back-up plate 40 is selected from among the plurality of back-up pins 11 or 25 which are stored in the stocker 44, the holder main body 15 of the back-up pin 11 or 25 is grasped by the chuck, and after the back-up pin 11 or 25 is pulled up from the stocker 44, the back-up pin 11 or 25 is moved to above the pin mounting position which is the target on the back-up plate 40, and the back-up pin 11 or 25 is lowered to be mounted on the back-up plate 40. Accordingly, the back-up pin 11 or 25 is attracted and held in the pin mounting position which is the target on the back-up plate 40 by a magnetic force of the magnet 28 of the holder main body 15 of the back-up pin 11 or 25.

A component imaging camera 53 (refer to FIG. 9) which images the component which is sucked by the suction nozzle of the mounting head from the bottom surface side of the component, and a mark imaging camera 54 (refer to FIG. 9) which images the fiducial position marks (not shown) on the circuit board are provided in the component mounting machine. The mounting head moving device 52 (refer to FIG. 9) moves the mark imaging camera 54 integrally with the mounting head, and is also used as a camera which images a region including the soft back-up pin 11 and the background portion 29 of the outer circumference thereof on the back-up plate 40 from above.

Note that, in a case in which the hard back-up pin 25 is mounted on the back-up plate 40, the hard back-up pin 25 is imaged by the camera 54, and the recognition mark 30 of the top end of the hard back-up pin 25 is recognized from the captured image. Since the shapes of the recognition marks (the background portions) 29 and 30 differ between the soft back-up pin 11 and the hard back-up pin 25, it is possible to distinguish the soft back-up pin 11 from the hard back-up pin 25 by recognizing the shapes of the recognition marks 29 and 30 from the captured image.

As illustrated in FIG. 9, an input device 55 such as a keyboard, a mouse, or a touch panel, a display device 56 such as an LCD, an EL, or a CRT, and the like are connected to the control device 51 of the component mounting machine. Furthermore, an image processing unit 57 (image processing means) which processes the image which is captured by the component imaging camera 53 or the mark imaging camera 54 is embedded in the control device 51. As illustrated in FIG. 1, when checking the state of the soft back-up pin 11 on the back-up plate 40, the control device 51 uses the mounting head moving device 52 to move the camera 54 to above the soft back-up pin 11 on the back-up plate 40, frames the soft pin portion 13 of the soft back-up pin 11 and the background portion 29 of the outer circumference thereof in the visual field of the camera 54, captures an image using the camera 54, uses the image processing unit 57 to process the captured image by the camera to recognize the background portion 29 of the outer circumference of the soft pin portion 13 of the soft back-up pin 11, and thereby recognizes the inner circumferential edge of the background portion 29 as the outer circumferential edge of the soft pin portion 13 of the soft back-up pin 11.

At this time, in a case in which there is no deformation such as bending in the soft pin portion 13 of the soft back-up pin 11, and the soft pin portion 13 is standing straight (that is, in a case in which the soft back-up pin 11 is in the normal state), as illustrated in FIG. 8A, the inner circumferential edge of the background portion 29 appears as a complete circle in the image which is captured by the camera 54.

In contrast, as illustrated in FIG. 7, in a case in which deformation such as bending occurs in the soft pin portion 13 of the soft back-up pin 11, since the position of the top end of the soft pin portion 13 is shifted, as illustrated in FIG. 8B, the image of the background portion 29 which is captured by the camera 54 is an image in which the top end of the soft pin portion 13 overhangs the background portion 29, the shape of the inner circumferential edge of the background portion 29 cannot be recognized as a complete circle, and the shape of the inner circumferential edge of the background portion is partially deformed. Using this relationship, the control device 51 determines whether or not a deformed portion is present in the shape of the inner circumferential edge of the background portion 29 which is recognized by the image processing of the image processing unit 57 (whether or not it is not possible to recognize a complete circle), and in a case in which a deformed portion is present in the shape of the inner circumferential edge of the recognized background portion 29 (in a case in which it is not possible to recognize a complete circle), the control device 51 determines that deformation such as bending is present in the soft back-up pin 11. In this case, the control device 51 warns the worker of an abnormality in the soft pin portion 13 using a display or audio, recognizes the outer circumferential edge (the outer circumference) of the background portion 29 based on the image processing results of the image processing unit 57, recognizes the position of the soft pin portion 13 of the inner circumferential side of the background portion 29, and automatically exchanges the soft pin portion 13. Accordingly, it is possible to automatically exchange the soft back-up pin 11 in which there is deformation such as bending for another soft back-up pin, and it is possible to continue production without stopping the component mounting machine. Meanwhile, if the control device 51 determines that a deformed portion is not present in the shape of the inner circumferential edge of the background portion 29 which is recognized by the image processing of the image processing unit 57, the control device 51 determines that the soft back-up pin 11 is the normal-state soft back-up pin 11 with no deformation such as bending.

When solder is adhered to the top end of the soft back-up pin 11, the solder-adhered portion appears to be shining in the image which is captured by the camera 54. Therefore, the control device 51 determines whether or not a portion which appears to be shining (or appears to be dark) is present in the region in which the soft back-up pin 11 is present inside of the ring-shaped background portion 29 which is recognized by the image processing of the image processing unit 57, and if a portion which appears to be shining (or appears to be dark) is present in the region in which the soft back-up pin 11 is present inside of the ring-shaped background portion 29, the control device 51 determines that the portion is a portion to which solder or the like is adhered, and, if a portion which appears to be shining (or appears to be dark) is not present, the control device 51 determines that foreign matter such as solder is not adhered to the soft back-up pin 11. Note that, when observing the solder, the lighting pattern of the camera 54 may be changed from the lighting pattern when the fiducial position marks of the circuit board 35 are captured.

When adhered matter such as solder on the soft back-up pin 11 or deformation of the soft back-up pin 11 is recognized by the image processing of the image processing unit 57, the control device 51 warns the worker thereof using a display or audio of the display device 56 (warning means). In this manner, when adhered matter such as solder on the soft back-up pin 11 or deformation of the soft back-up pin 11 is recognized, it is possible to urge the worker to exchange the soft back-up pin 11. For the exchanging of the soft back-up pin 11, the entirety of the soft back-up pin 11 may be exchanged, or alternatively, the soft pin portion 13 may be removed from the fitting portion 17 of the plug portion 16 by loosening the fixing screw 19, and only the soft pin portion 13 may be exchanged.

When adhered matter such as solder on the soft back-up pin 11 or deformation of the soft back-up pin 11 is recognized by the image processing of the image processing unit 57, the control device 51 may automatically exchange the soft back-up pin 11 using the automatic exchanging operation of the soft back-up pin 11 which is described above.

In a case in which deformation of the soft back-up pin 11 is not recognized by the image processing of the image processing unit 57 and the shape of the inner circumferential edge of the background portion 29 is recognized as a complete circle, the control device 51 measures the XY coordinates of the center position of the inner circumferential edge of the recognized background portion 29 as XY coordinates of the center position of the soft back-up pin 11, and determines whether the soft back-up pin 11 is disposed in the specified pin position depending on whether or not the XY coordinates of the center position of the soft back-up pin 11 match the XY coordinates of the pin position which is specified in the production job in an allowable error range. As a result, if it is determined that the soft back-up pin 11 is not disposed in the specified position, the soft back-up pin 11 is transposed to the specified pin position using the automatic transfer operation of the soft back-up pin 11 which is described earlier. Subsequently, once more, the position of the soft back-up pin 11 is recognized using the image processing, and it is checked that the soft back-up pin 11 is transposed to the specified pin position. Accordingly, it is possible to dispose the soft back-up pin 11 automatically on the back-up plate 40 according to the production job.

According to Example 1 which is described above, since the inner circumferential edge of the background portion 29 is recognized as the outer circumferential edge of the soft back-up pin 11 by imaging the soft back-up pin 11 on the back-up plate 40 and the background portion 29 of the outer circumference thereof using the camera 54 of the component mounting machine, processing the captured image by the camera 54 using the image processing unit 57, and recognizing the ring-shaped background portion 29 of the outer circumference of the soft back-up pin 11, even if there is a situation in which it is difficult to accurately recognize the top end portion of the soft back-up pin 11 using the image processing, by providing the background portion 29 which is possible to be recognized using image processing in the outer circumference of the soft back-up pin 11, it is possible to recognize the inner circumferential edge of the background portion 29 which is recognized using the image processing as the outer circumferential edge of the soft back-up pin 11, and it is possible to precisely recognize the shape of the outer circumferential edge of the soft back-up pin 11. Accordingly, it is possible to precisely detect the position of the soft back-up pin 11, automatic disposition of the soft back-up pin becomes possible, it is possible to perform image recognition on adhered matter such as solder on the soft back-up pin 11 and deformation such as bending of the soft back-up pin 11, and, when adhered matter such as solder on the soft back-up pin 11 or deformation such as bending of the soft back-up pin 11 is recognized, it is possible to quickly exchange the soft back-up pin 11 (the entirety of the soft back-up pin 11 or only the soft pin portion 13).

Note that, the connecting structure and the shape of the soft back-up pin 11 are not limited to those of Example 1, and, for example, it goes without saying that various changes may be made to the connecting structure and the shape of the soft back-up pin 11 such as changing the connection between the soft pin portion 13 and the holder portion 12 from screw fixing to an engagement system, or alternatively, changing the holder portion 12 from a two piece structure to a one piece structure.

Note that, the shape of the background portion 29 of the soft back-up pin 11 is not limited to a ring shape, the shape of the inner circumferential edge of the background portion 29 may be circular, and the shape of the outer circumferential edge of the background portion 29 may not be circular. For example, the shape of the background portion 29 may be a regular polygon such as a regular rhombus of which the center matches that of the inner circumferential edge (the inner circumference) of the background portion 29, and may also be another shape. Since, if the shape of the outer circumferential edge of the background portion 29 is a circle or a regular polygon, the center position of the outer circumferential edge of the background portion 29 matches the center position of the soft back-up pin 11 which is positioned on the inner circumferential side of the background portion 29, in a case in which the top end of the soft pin portion 13 of the soft back-up pin 11 overhangs the background portion 29 and it is not possible to recognize the shape of the inner circumferential edge of the background portion 29 as a complete circle (in a case in which it is determined that the soft back-up pin 11 is deformed), it is possible to recognize the outer circumferential edge of the background portion 29 to check the position of the soft back-up pin 11.

The shape of the recognition mark 30 on the top end of the hard back-up pin 25 is not limited to a circle, and it goes without saying that this may be changed to another shape.

In addition, the disclosure is not limited to Example 1, the positions of the stockers 44 may be changed, the positions of the soft back-up pins 11 which are stored in the stockers 44 may be recognized using image processing, and it is possible to carry out by applying the disclosure to a component mounting machine configured not to have the stocker 44.

Example 2

Next, description will be given of Example 2 of the disclosure using FIGS. 10 and 11. However, for portions which are effectively the same as in Example 1, the same symbols will be assigned and description will be omitted or simplified, and description will mainly be given of different portions.

In Example 1, the soft back-up pin 11 is formed of the bottom-side holder portion 12, and the top-side soft pin portion 13 which is held by the holder portion 12 in an exchangeable manner; however, in Example 2 of the disclosure illustrated in FIGS. 10 and 11, a plurality of soft back-up pins 61 are formed of a soft elastic material such as urethane or rubber and are formed integrally on a block board 62, and a cover plate 63 is caused to overlap the block board 62. The cover plate 63 is formed of metal, plastic, or the like, and is configured to be possible to be distinguished from the soft back-up pin 61 and be recognized using image processing. An insertion hole 64 having substantially the same diameter as or slightly larger diameter than that of the soft back-up pin 61 is formed in the cover plate 63 in the same disposition on the block board 62 as the disposition of the soft back-up pin 61. The cover plate 63 is caused to function as a background portion of the outer circumference of each of the soft back-up pins 61 by causing the cover plate 63 to overlap the block board 62 by inserting the soft back-up pins 61 on the block board 62 into the insertion holes 64 of the cover plate 63, and covering the top face of the block board 62 with the cover plate 63. In this state, the block of the soft back-up pins 61 is mounted on the back-up plate 40 and used.

Note that, by providing fiducial marks (not shown) indicating the directionality and the fiducial position of the cover plate 63 in a predetermined position (for example, a corner position) of the top face of the cover plate 63, imaging the fiducial marks using the camera 54, processing the image using the image processing unit 57, and recognizing the fiducial marks, it is possible to check the directionality and the fiducial position of the cover plate 63.

Even in Example 2, in a case in which the state of the soft back-up pin 61 is checked, the mounting head moving device 52 moves the camera 54 to above the soft back-up pin 61, the soft back-up pin 61 and the cover plate 63 which is the background portion of the outer circumference thereof is framed in the visual field of the camera 54, an image is captured by the camera 54, the captured image by the camera 54 is processed by the image processing unit 57 to recognize the cover plate 63 of the outer circumference of the soft back-up pin 61, and thereby, the inner circumferential edge of the insertion hole of the cover plate 63 is recognized as the outer circumferential edge of the soft back-up pin 61. In this manner, even in a case in which a pin block in which the plurality of soft back-up pins 61 are formed on the block board 62 is used, it is possible to obtain the same effects as in Example 1 merely by causing the cover plate 63 to overlap the block board 62.

Note that, in a case in which a pin block in which the plurality of soft back-up pins 61 are formed integrally on the block board 62 is used, instead of the cover plate 63, the top face of the block board 62 may be colored such that it is possible to be distinguished from the soft back-up pins 61 and be recognized using image processing to cause the top face of the block board 62 to function as the background portion of the outer circumference of each of the soft back-up pins 61. In this manner, even in a case in which a pin block is used, it is possible to obtain the same effects as in Example 1 merely by coloring the top face of the block board 62 such that it is possible to use the top face of the block board 62 as the background portion.

In addition, it goes without saying that the disclosure is not limited to the examples described above, and it is possible to carry out with various modifications.

REFERENCE SIGNS LIST

11 . . . soft back-up pin, 12 . . . holder portion, 13 . . . soft pin portion, 15 . . . holder main body, 16 . . . plug portion, 17 . . . fitting portion, 18 . . . screw hole, 19 . . . fixing screw, 25 . . . hard back-up pin, 26 . . . hard pin portion, 28 . . . magnet, 29 . . . background portion, 30 . . . recognition mark, 32 . . . component mounting station, 33, 34 . . . conveyor, 35 . . . circuit board, 40 . . . back-up plate, 42 . . . previously-attached component, 43 . . . clamp member, 44 . . . stocker, 51 . . . control device, 52 . . . mounting head moving device, 54 . . . mark imaging camera, 56 . . . display device (warning means), 57 . . . image processing unit (image processing means), 61 . . . soft back-up pin, 62 . . . block board, 63 . . . cover plate (background portion), 64 . . . insertion hole

The invention claimed is:

1. A soft back-up pin state checking device which checks a state of a soft back-up pin made of a soft elastic material which supports, from below, a circuit board onto which components are mounted in a component mounting station of a component mounting machine, the soft back-up pin state checking device comprising:
    a camera which images a region including the soft back-up pin from above;
    image processing means for processing a captured image by the camera; and
    a background portion to which the soft back-up pin is exchangeably provided and surrounding an outer circumference of the soft back-up pin, the background portion distinguished from the soft back-up pin and recognized using the image processing means;
    wherein the image processing means recognizes the soft back-up pin touching an inner circumferential edge of the background portion by processing the captured image, and determines a difference between XY coordinates of a center position of the soft back-up pin and XY coordinates of a specified pin position is within an allowable error range; and
    the image processing means determines the soft back-up pin is in need of a replacement if the difference is not within the allowable error range.

2. The soft back-up pin state checking device according to claim 1,
    wherein the image processing means determines whether or not adhered matter is present on the soft back-up pin based on the inner circumferential edge of the background portion.

3. The soft back-up pin state checking device according to claim 1,
    wherein the image processing means determines that the soft back-up pin is deformed when a deformed portion is present in a shape of the inner circumferential edge of the recognized background portion.

4. The soft back-up pin state checking device according to claim 3,
    wherein the background portion is formed in a ring shape, and
    wherein the image processing means recognizes the outer circumferential edge of the background portion to check the position of the soft back-up pin when it is determined that the soft back-up pin is deformed.

5. The soft back-up pin state checking device according to claim 2, further comprising:
    warning means for warning a worker, when adhered matter on the soft back-up pin or deformation of the soft back-up pin is recognized by the image processing means, of the fact using a display and/or audio.

6. The soft back-up pin state checking device according to claim 2,
    wherein a function of automatically exchanging the soft back-up pin is installed in the component mounting machine, and
    wherein the component mounting machine automatically exchanges the soft back-up pin when adhered matter on the soft back-up pin or deformation of the soft back-up pin is recognized by the image processing means.

7. The soft back-up pin state checking device according to claim 1,
    wherein the soft back-up pin is formed of a bottom-side holder portion, and a top-side soft pin portion which is held by the holder portion in an exchangeable manner, and
    wherein a background portion is provided on a portion outside the outer circumference of the soft pin portion in the holder portion.

8. The soft back-up pin state checking device according to claim 1,
    wherein a plurality of the soft back-up pins are formed on a block board,
    wherein a cover plate is provided to overlap the block board,
    wherein the cover plate is formed to be distinguished from the soft back-up pin and be recognized by the image processing means, and
    wherein the cover plate is used as the background portion by inserting the soft back-up pin through an insertion hole which is formed in the cover plate, overlapping the block board with the cover plate, and covering a top face of the block board with the cover plate.

9. The soft back-up pin state checking device according to claim 1,
    wherein a plurality of the soft back-up pins are formed on a block board, and
    wherein a top face of the block board is colored to be distinguished from the soft back-up pin and be recognized by the image processing means and is used as the background portion.

10. The soft back-up pin state checking device according to claim 7,
    wherein the holder portion is insertable into the background portion.

11. A soft back-up pin state checking device which checks a state of a soft back-up pin made of a soft elastic material which supports, from below, a circuit board onto which components are mounted in a component mounting station of a component mounting machine, the soft back-up pin state checking device comprising:
    a camera which images a region including the soft back-up pin from above;
    a processor to process a captured image by the camera; and
    a background portion to which the soft back-up pin is exchangeably provided and surrounding an outer circumference of the soft back-up pin, the background portion distinguished from the soft back-up pin and recognized using the processor, wherein the processor recognizes the soft back-up touching an inner circumferential edge of the background portion by processing the captured image, and determines a difference between XY coordinates of a center portion of the soft back-up pin and XY coordinates of a specified pin position is within an allowable error range;

the processor determines the soft back-up pin is in need of a replacement if the difference is not within the allowable error range; and the component mounting machine exchanges the soft back-up pin when adhered matter on the soft back-up pin or deformation of the soft back-up pin is recognized by the processor.

\* \* \* \* \*